(12) United States Patent
Adachi et al.

(10) Patent No.: US 9,345,180 B2
(45) Date of Patent: May 17, 2016

(54) SHIELDING CONSTRUCTION AND WIRING HARNESS

(71) Applicant: YAZAKI CORPORATION, Tokyo (JP)

(72) Inventors: Hideomi Adachi, Shizuoka (JP); Yoshiaki Ozaki, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/254,466

(22) Filed: Apr. 16, 2014

(65) Prior Publication Data

US 2014/0238735 A1  Aug. 28, 2014

Related U.S. Application Data

(63) Continuation of application No. PCT/JP2012/080804, filed on Nov. 21, 2012.

(30) Foreign Application Priority Data

Nov. 25, 2011 (JP) ................................ 2011-256943

(51) Int. Cl.
*H05K 9/00* (2006.01)
*H01R 4/20* (2006.01)
(Continued)

(52) U.S. Cl.
CPC ............. *H05K 9/0007* (2013.01); *H01R 4/20* (2013.01); *H01R 13/658* (2013.01); *H05K 9/0098* (2013.01); *B60R 16/0207* (2013.01); *H01R 9/0518* (2013.01); *H01R 2201/26* (2013.01)

(58) Field of Classification Search
CPC ......... H01R 4/20; H01R 4/186; H01R 13/658

USPC .................................................... 174/359, 360
See application file for complete search history.

(56) References Cited

U.S. PATENT DOCUMENTS 4,781,605 A * 11/1988 Herubel ................... H01R 4/01
439/161
6,648,690 B2 * 11/2003 Saito ..................... H01R 9/0524
439/607.44

(Continued)

FOREIGN PATENT DOCUMENTS

EP    0 595 296 A2    5/1994
EP    0 902 502 A1    3/1999
(Continued)

OTHER PUBLICATIONS

International Search Report and Written Opinion of the International Search Report for PCT/JP2012/080804 dated Feb. 12, 2013.
(Continued)

*Primary Examiner* — Hung V Ngo
(74) *Attorney, Agent, or Firm* — Kenealy Vaidya LLP

(57) ABSTRACT

Edge portions are formed on a shell fixing portion, disposed in upper and lower positions on the shell fixing portion and formed extending horizontally. Crimp pieces are continuously formed on the edge portions, and the crimp pieces are folded back at the edge portions therealong so as to extend towards a distal end of a cylindrical shell portion. The crimp pieces each have a rectangular flat plate-like shape and disposed facing oppositely corresponding external flat surface portions of the cylindrical shell portion with a predetermined space defined therebetween. The crimp pieces are formed as a crimping applied portion and the cylindrical shell portion is formed as a crimping bearing portion.

4 Claims, 4 Drawing Sheets

(51) Int. Cl.
 *H01R 13/658* (2011.01)
 *B60R 16/02* (2006.01)
 *H01R 9/05* (2006.01)

(56) References Cited

U.S. PATENT DOCUMENTS

| | | | |
|---|---|---|---|
| 6,924,432 B1* | 8/2005 | Connors | H02G 3/22 174/19 |
| 7,044,756 B1 | 5/2006 | Asakura et al. | |
| 7,674,972 B2* | 3/2010 | Gladd | H01R 13/658 174/34 |
| 8,878,079 B2* | 11/2014 | Colahan | 174/357 |
| 2002/0134565 A1* | 9/2002 | Hashizawa | H01R 13/521 174/358 |
| 2003/0221850 A1* | 12/2003 | Mizutani | H01R 13/6592 174/36 |
| 2004/0099428 A1 | 5/2004 | Miyazaki | |
| 2005/0266729 A1* | 12/2005 | Fukushima | H01R 9/032 439/607.46 |
| 2006/0121758 A1 | 6/2006 | Asakura et al. | |
| 2007/0270037 A1* | 11/2007 | Deterre | H01R 4/72 439/607.41 |
| 2009/0093159 A1 | 4/2009 | Aoki et al. | |
| 2009/0260232 A1 | 10/2009 | Aoki et al. | |
| 2013/0168150 A1* | 7/2013 | Sakakura | H02G 3/22 174/650 |
| 2013/0233616 A1* | 9/2013 | Okuyama | H02G 15/007 174/652 |
| 2014/0190744 A1* | 7/2014 | Fuzioka | H02G 3/32 174/77 R |

FOREIGN PATENT DOCUMENTS

| | | |
|---|---|---|
| FR | 2 913 822 A | 9/2008 |
| JP | 9-213420 A | 8/1997 |
| JP | 11-262151 A | 9/1999 |
| JP | 2004-178913 A | 6/2004 |
| JP | 2006-164613 A | 6/2006 |
| JP | 2009-87902 A | 4/2009 |

OTHER PUBLICATIONS

Japanese Office Action for the related Japanese Patent Application No. 2011-256943 dated May 19, 2015.
Chinese Office Action for the related Chinese Patent Application No. 201280057846.8 dated Sep. 2, 2015.

* cited by examiner

SHIELDING CONSTRUCTION AND WIRING HARNESS

CROSS REFERENCE TO RELATED APPLICATIONS

This application is a continuation of PCT application No. PCT/JP2012/080804, which was filed on Nov. 21, 2012 based on Japanese patent application (patent application 2011-256943) filed on Nov. 25, 2011, the contents of which are incorporated herein by reference. Also, all the references cited herein are incorporated as a whole.

BACKGROUND OF THE INVENTION

1. Technical Field

The present invention relates to a shielding construction that adopts crimping in fixedly connecting an end portion of a shielding member to a shielding shell and a wiring harness that adopts this shield construction.

2. Background Art

Japanese Patent Publication No. JP-A-2009-87902 below discloses a shielding construction in which an end portion of a braid that is disposed on an external side of an electric wire and a shielding shell that is disposed at a terminating end of an electric wire are electrically connected together by crimping a ring-shaped shielding ring.

In the configuration described above, the braid is a so-called shielding member and is formed by interlacing fine metallic strands having conductivity into a cylindrical configuration. Additionally, the shielding shell is a metallic component having conductivity, and a portion to which the end portion of the braid is connected is formed on an outer circumferential surface of the shielding shell.

The shielding ring has a configuration which enables the end portion of the braid to be inserted to be placed on an inner side thereof. Additionally, the shielding ring also has a configuration which enables crimping to be applied thereto from an outside thereof. When the shielding ring that is configured in the way described above is crimped, the braid is brought into contact with the shielding shell so as to be electrically connected thereto.

SUMMARY OF THE INVENTION

Incidentally, in the related art shielding construction described above, since the shielding ring is a component that is separate from the shielding shell, it is necessary that the end portion of the braid is inserted to be placed on the inner side of the shielding ring and that the shielding ring is positioned properly before it is crimped. Thus, this related art shielding construction has its inherent problem that the working performance is deteriorated. Additionally, the shielding ring is the separate component, the number of components associated with the shielding construction is increased, leading to a problem that the component management becomes complex and troublesome and a problem that the production costs are increased.

Having been made in view of these situations, the invention is intended to solve a problem of how to provide a shielding construction that can realize an improvement in working performance and a reduction in the number of components involved and production costs. Additionally, the invention is intended to solve a problem of how to provide a wiring harness that adopts the shielding construction above.

According to one aspect of the present invention, there is provided a shielding construction in which crimping is adopted in fixedly connecting a conductive shielding shell having a cylindrical shell portion formed into a cylindrical configuration and a shell fixing portion that is contiguous with a proximal end portion of the cylindrical shell portion, with a conductive shielding member that covers one or a plurality of conductive paths together, wherein the shielding shell has one or a plurality of crimp pieces that are formed integrally therewith so as to extend towards a distal end of the cylindrical shell portion, and the crimp pieces are each formed into a flat plate-like shape as a form resulting before crimping.

According to the first aspect of the invention that is characterized in the way described above, in fixedly connecting the shielding member to the shielding shell through crimping, the crimp pieces are used. The crimp pieces are formed integrally with the shielding shell as crimping applied portions. The number of crimp pieces may be one, provided that the shielding member can be fixedly connected to the cylindrical shell portion. When taking stability and tension on the shielding member into deep consideration, it is preferable to form, for example, a pair of upper and lower crimp pieces on the cylindrical shell portion. Additionally, the crimping applied portions and the crimping bearing portions are formed into the flat surfaces. By adopting this configuration, the stable crimped state is provided, compared with, for example, curved surfaces. Furthermore, a sufficient strength is also ensured.

In the shielding construction as above described, the shielding shell may be formed by pressing a piece of sheet metal, and the crimp pieces may be formed by being folded back at edge portions of the shell fixing portion therealong or being folded back at the proximal end portion of the cylindrical shell portion.

According to the second aspect of the invention that is characterized in the way described above, the integration of the crimp pieces is facilitated by forming the shielding shell by pressing the piece of sheet metal. In addition to pressing the piece of sheet metal, aluminum die casting is raised as one example that facilitates the integration of the crimp pieces.

In the shielding construction as above described, the crimp pieces may be disposed on external flat surface portions of the cylindrical shell portion so as to face oppositely each other.

A wiring harness may comprise the shielding construction as above described.

According to the fourth aspect of the invention that is characterized in the way described above, the wiring harness is provided which includes the shielding construction set forth in the first, second or third aspect of the invention.

According to the first aspect of the invention, in fixedly connecting the shielding member to the shielding shell through crimping, since the crimp pieces are integrated with the shielding shell as the crimping applied portions, the shielding member can be fixedly connected to the shielding shell only by one component, compared with the related art shielding construction in which the shielding member is fixedly connected to the shielding shell by the two components of the shielding shell and the shielding ring. Consequently, compared with the related art shielding construction, according to the shielding construction of the invention, it is possible not only to reduce the number of components involved but also to reduce the number of working steps. As a result, the invention is advantageous not only in that the working performance can be improved but also in that the number of components and production costs can be reduced.

According to the second aspect of the invention, the following advantage is also provided in addition to the advantage provided by the first aspect of the invention. Namely, since the shielding shell is formed by pressing the piece of sheet metal, the invention is advantageous in that the crimp pieces can also be easily integrated with the shielding shell.

According to the third aspect of the invention, the following advantage is also provided in addition to the advantage provided by the first or second aspect of the invention. Namely, since the crimp pieces are formed into the flat plate-like shape and are disposed so as to face oppositely to the external flat surface portions of the cylindrical shell portion, the invention is advantageous in that the crimped state can be stabilized and the strength can be ensured.

According to the fourth aspect of the invention, since the wiring harness is provided which adopts the shielding construction described above, the aforesaid advantages can also be provided as the wiring harness. Namely, it is possible to provide the wiring harness that can realize not only an improvement in working performance but also a reduction in both the number of components involved and production costs. Consequently, the wiring harness can be provided which is better than the wiring harness adopting the related art shielding construction.

BRIEF DESCRIPTION OF THE DRAWINGS

FIGS. 1A and 1B show diagrams showing a shielding construction and a wiring harness according to the invention, of which FIG. 1A is an exemplary diagram of a motor vehicle showing a state in which a wiring harness is laid therein and FIG. 1B is a diagram showing a shielding construction and the configuration of the wiring harness.

DETAILED DESCRIPTION OF EMBODIMENTS

A shielding shell has integral crimp pieces that are portions to be crimped in fixedly connecting an end portion of a shielding member thereto. These crimp pieces are components that correspond to the conventional shielding ring.

Embodiment

Figure 1A:
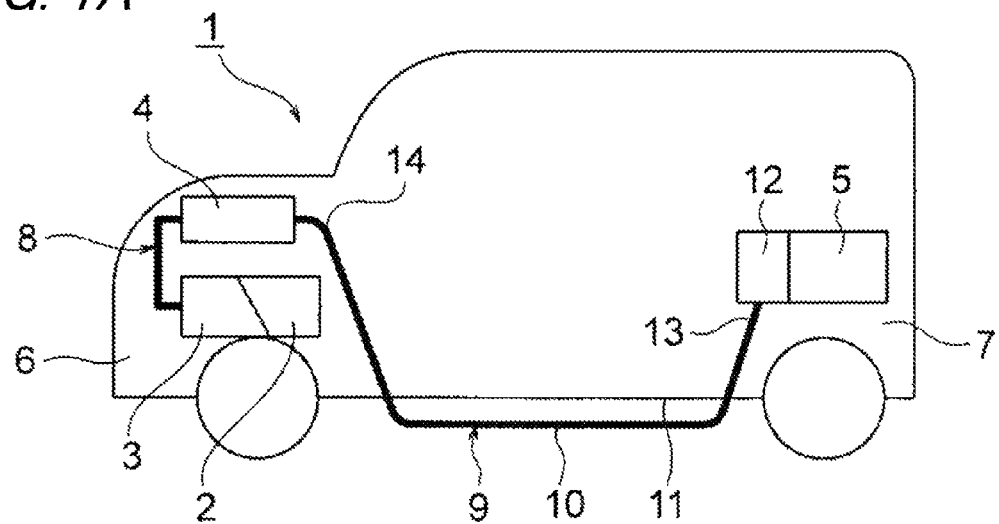
Figure 1B:
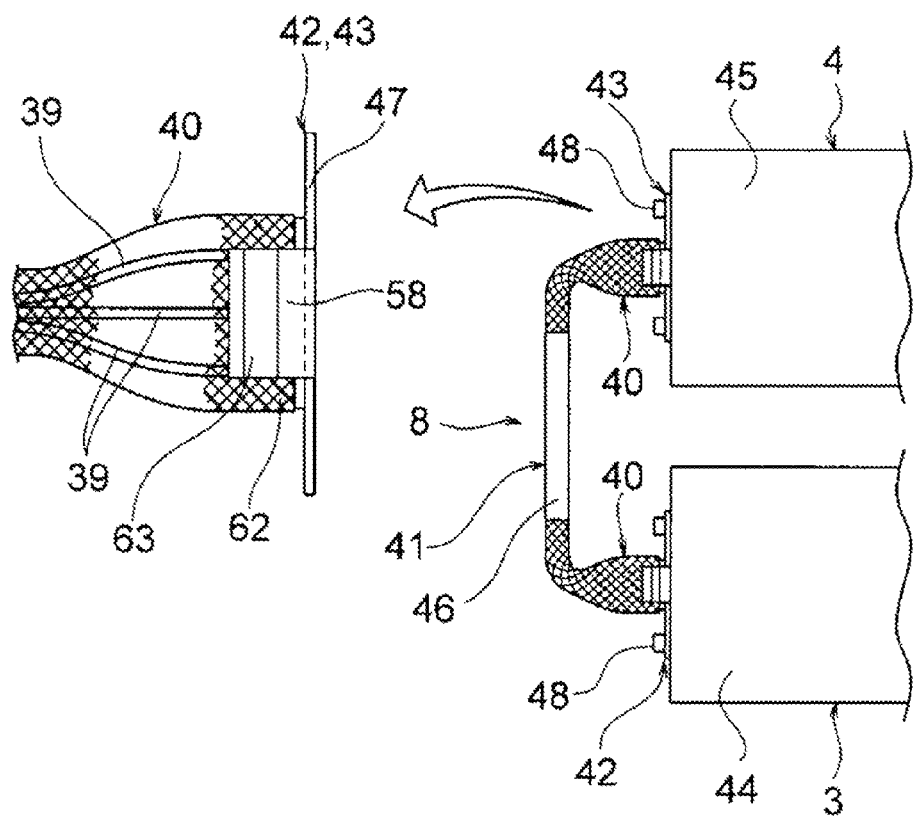
Figure 2:
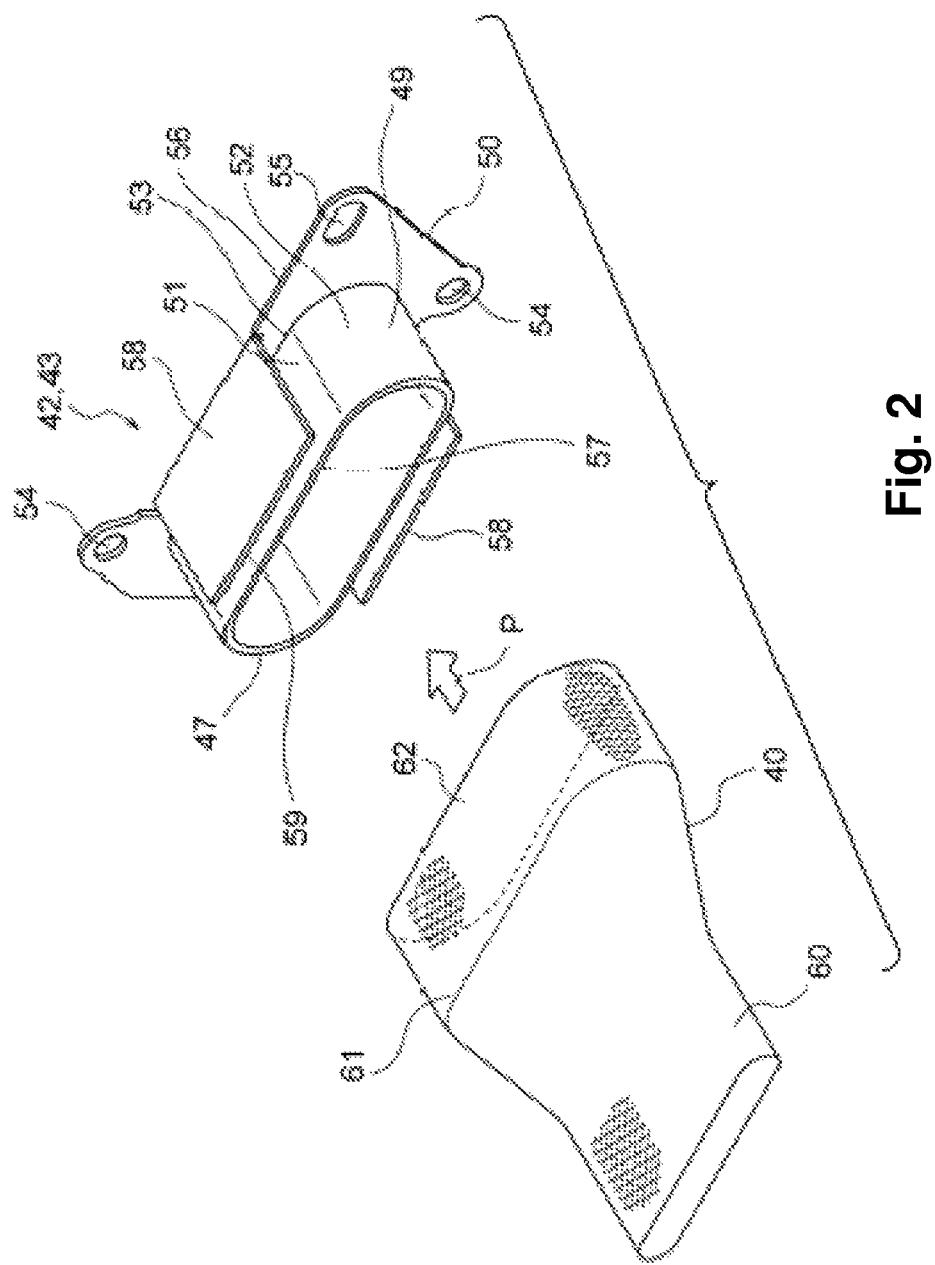
FIG. 2 is a perspective view of a braid and a shielding shell before they are fixedly connected together.
Figure 3:
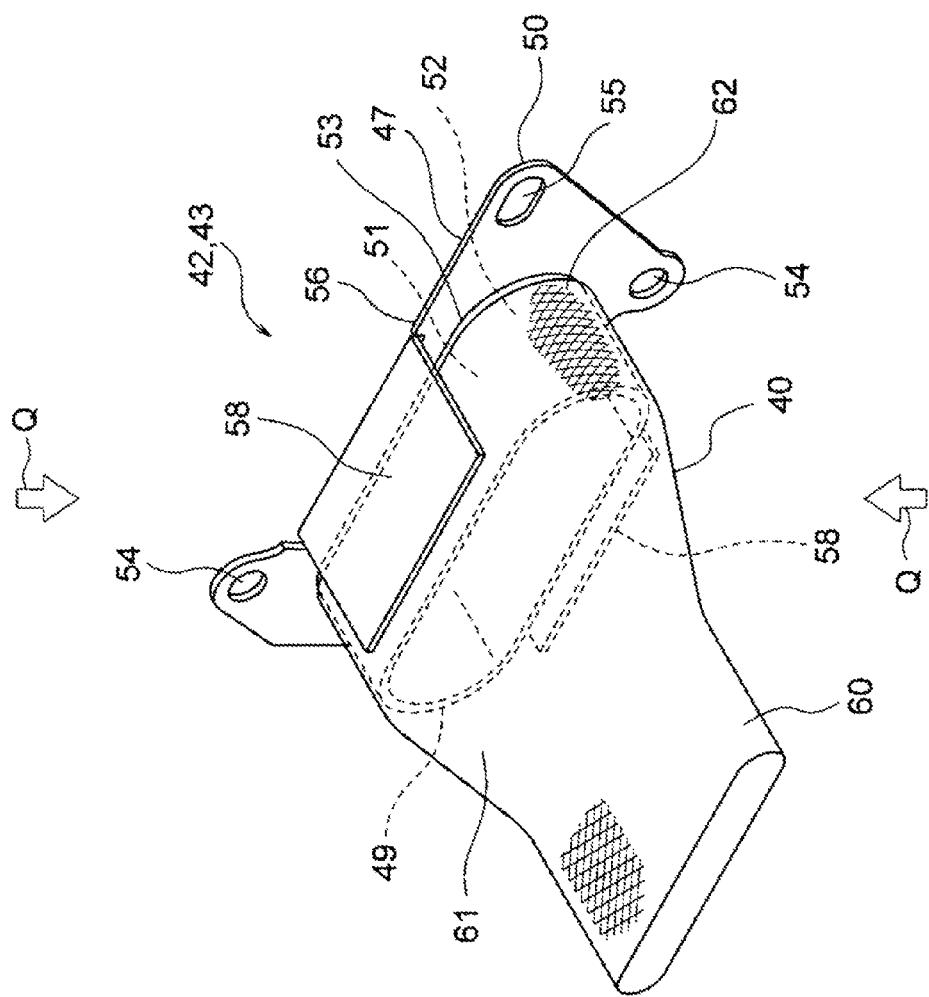
FIG. 3 is a perspective view showing a state in which the braid is fitted on the shielding shell.
Figure 4:
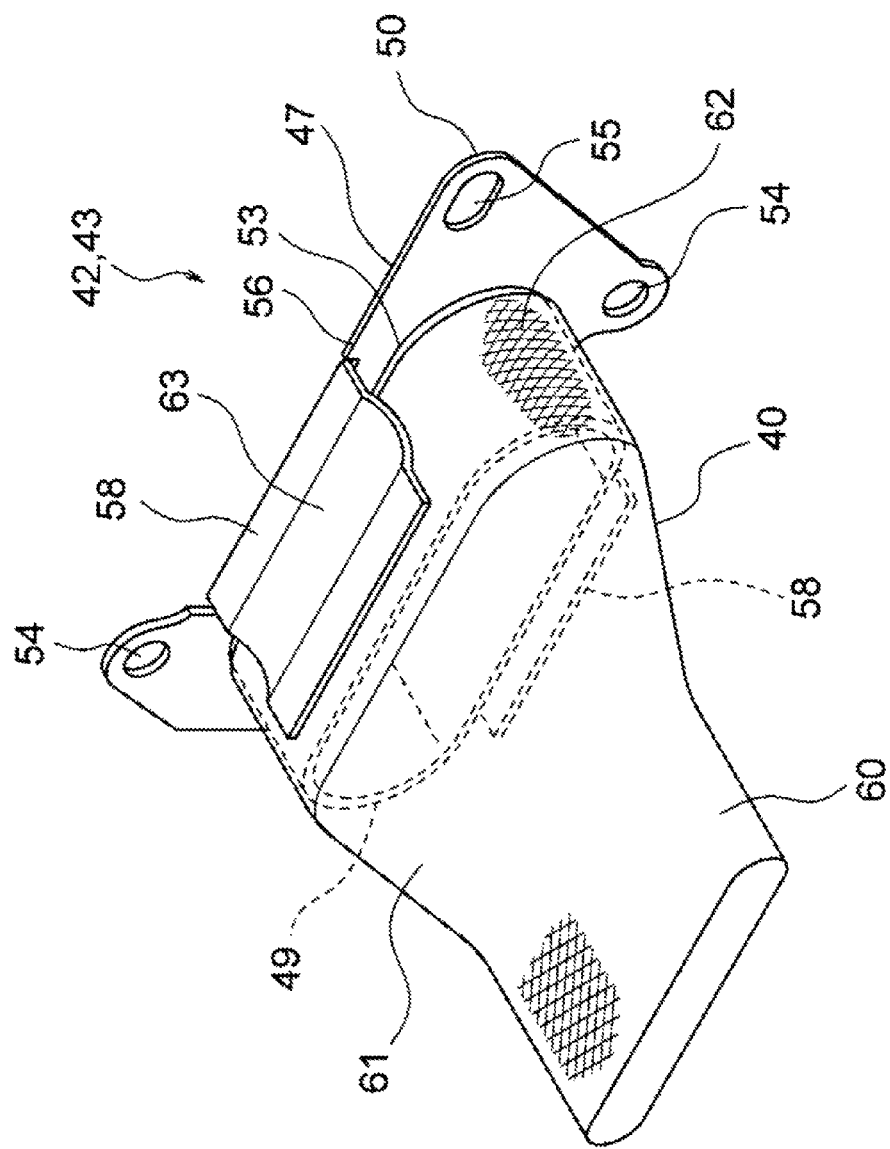
FIG. 4 is a perspective view showing a state in which the braid is fixedly connected to the shielding shell by being crimped.

Hereinafter, an embodiment will be described by reference to the drawings. FIGS. 1A and 1B show diagrams showing a shielding construction and a wiring harness according to the invention, of which FIG. 1A is an exemplary diagram of a motor vehicle showing a state in which a wiring harness is laid therein and FIG. 1B is a diagram showing a shielding construction and the configuration of the wiring harness. Additionally, FIG. 2 is a perspective view of a braid and a shielding shell before they are fixedly connected together, FIG. 3 is a perspective view showing a state in which the braid is fitted on the shielding shell, and FIG. 4 is a perspective view showing a state in which the braid is fixedly connected to the shielding shell by being crimped.

This embodiment will be described as a shielding construction and a wiring harness of the invention being applied to a hybrid vehicle (or an electric vehicle).

In FIG. 1A, reference numeral 1 denotes a hybrid vehicle. The hybrid vehicle 1 is a vehicle that is driven by combining the power of an engine 2 and the power of a motor unit 3. Electric power is supplied from a battery 5 (a battery pack) to the motor unit 3 via an inverter unit 4. In this embodiment, the engine 2, the motor unit 3 and the inverter unit 4 are mounted in an engine compartment 6 that is situated in a position where front wheels are provided. Additionally, the battery 5 is mounted at a rear part 7 of the hybrid vehicle where rear wheels are provided (or the battery 5 may also be mounted in a passenger compartment of the hybrid vehicle that is situated rearwards of the engine compartment 6).

The motor unit 3 and the inverter unit 4 are connected to each other by a high-voltage wiring harness 8. Additionally, the battery 5 and the inverter unit 4 are connected to each other by a high-voltage wiring harness 9. The wiring harness 9 is designed for a high-voltage application. A middle portion 10 of the wiring harness 9 is laid underneath a side of a floor 1 of a vehicle body that faces the ground. Also, the middle portion 10 is laid substantially parallel to the floor 11 of the vehicle body. The floor 11 of the vehicle body is a known component part of the vehicle body which is a so-called panel member. Through holes (whose reference numeral is omitted) are formed in predetermined positions in the floor 11, and the wiring harness 9 is passed through these through holes.

The wiring harness 9 and the battery 5 are connected to each other via a junction block 12 that is provided on the battery 5. A rear end 13 of the wiring harness 9 is electrically connected to the junction block 12 by a known method. A front end 14 of the wiring harness 9 is electrically connected to the inverter unit 4 by a known method.

The motor unit 3 is configured so as to include a motor and a generator. Additionally, the inverter unit 4 is configured so as to include an inverter and a converter. The motor unit 3 is configured as a motor assembly that includes a shielding case. In addition, the inverter unit 4 is also configured as an inverter assembly that includes a shielding case. The battery 5 is made up of battery modules of Ni-MH or Li-ion battery cells. Note that a storage system like a capacitor, for example, can also be used. There is imposed no specific limitation on the battery 5, provided that a battery can be used in the hybrid vehicle 1 or the electric vehicle.

Firstly, the configuration and construction of the wiring harness 8 will be described (the configuration and construction to be described are also applicable to the wiring harness 9).

In FIG. 1B, the wiring harness 8 includes three high-voltage electric wires 39 (conductive paths), a braid 40 (a shielding member) that covers and shields the three high-voltage electric wires 39 altogether, a sheathing member 41 that is provided on an external side of a main body portion of the braid 40, a motor side connecting portion 42 that is provided at one end of the three high-voltage electric wires 39 and an inverter side connecting portion 43 that is provided at the other end thereof.

The wiring harness 8 has a shielding construction in which both end portions of the braid 40 are fixedly connected to the motor side connecting portion 42 and the inverter side connecting portion 43 and the braid 40 is electrically connected to shielding cases 44, 45 via the motor side connecting portion 42 and the inverter side connecting portion 43, respectively.

Firstly, the above constituent members will be described.

In FIG. 1B, the high-voltage electric wire 39 is a high-voltage conductive path that includes a conductor and an insulator (a covering) and has a length necessary for electrical connection. The conductor is made of copper or a copper alloy, or aluminum or an aluminum alloy. The conductor to be used may be either a conductor that is made up of interlaced strands or a rod-shaped conductor that has a rectangular or circular section (for example, a conductor having a flat angular single core or round single core construction, in which case an electric wire itself has a rod-like shape).

A metallic terminal fixture, not shown, is provided at ends of the high-voltage electric wire 39. These metallic terminal fixtures are inserted into interiors of the shielding cases 44 and 45 so as to be connected to electric connecting portions thereof by a known method.

In this embodiment, while the high-voltage electric wire 39 is used as a conductive path, the invention is not limited thereto. Namely, there may be adopted a high-voltage conductive path in which an insulator is provided on a known busbar or a high-voltage concentric composite conductive path in which circuits of n systems (n circuits) are disposed concentrically into a single wire.

As one example of the high-voltage concentric composite conductive path, there is raised a conductive path that includes either of a positive conductor or a negative conductor, a first insulator that is provided so as to cover an external side of either of the positive and negative conductors, the other of the positive conductor and the negative conductor that is provided so as to cover an external side of the first insulator and a second insulator that is provided so as to cover an external side of the other of the positive and negative conductors and in which these conductors and insulators are formed into a single cable.

In FIG. 1B and FIG. 2, the braid 40 is formed into an electromagnetic shielding tubular member (a shielding member adapted to deal with electromagnetic waves). In this embodiment, the braid 40 is formed into a configuration that can cover the three high-voltage electric wires 39 along the full length thereof. Many fine conductive strands are used to form the braid 40, and they are interlaced into a tubular configuration.

As an example of the strands used, a metallic strand of soft copper or fine strand of non-metallic fiber is raised. Carbon fiber or conductive resin fiber in which a conductive material is mixed into a resin material may be used as a non-metallic fiber. In addition to these strands, for example, a strand may be adopted in which a resin strand (a PET strand) is mixed in order to provide wear resistance.

In FIG. 1B, the sheathing member 41 is a member that covers to protect the three high-voltage electric wires 39 and the braid 40, and for example, a twist tube 46 and a corrugated tube, not shown, are used. The twist tube 46 is formed so as to wrap an external side of the braid 40 and is held by winding a tape, not shown, therearound. In addition to the corrugated tube, a tubular member may be used for the sheathing member 41. Additionally, as long as wear resistance and shock resistance can be imparted to the braid 40 in any other way, the sheathing member 41 may not be used.

In FIG. 1B and FIG. 2, the motor side connecting portion 42 and the inverter side connecting portion 43 each include the shielding shell 47 and a plurality of bolts 48 for fixedly connecting the shielding shell 47 to the shielding cases 44 and 45, respectively.

Note that a shielding connector construction may be adopted for the motor side connecting portion 42 and the inverter side connecting portion 44. Namely, these connecting portions may each be configured so as to include integrally a connector housing (whose illustration is omitted) for accommodating and holding the metallic terminal fixtures, not shown, at the ends of the high-voltage electric wires 39, a shielding shell 47 that is provided on an external side of the connector housing and a plurality of bolts 48.

The shielding shell 47 is formed, for example, into a configuration illustrated in the figures by pressing a piece of conductive sheet metal. The shielding shell 47 has a cylindrical shell portion 49 and a shell fixing portion 50.

The cylindrical shell portion 49 is formed into a cylindrical shape by drawing (press drawing) the sheet metal and thereafter removing a bottom portion. In this embodiment, the cylindrical shell portion 49 has an elliptic sectional shape. The three high-voltage electric wires 39 are inserted through an inside of the cylindrical shell portion 49 and the connector housing is fitted thereon.

Reference numeral 51 given to an outer circumferential surface of the cylindrical shell portion 49 denotes an external flat surface portion. Additionally, reference numeral 52 denotes an external curved surface portion. Since the cylindrical shell portion 49 has the elliptic sectional shape as described above, a pair of external flat surface portions 51 are provided on upper and lower surfaces, and a pair of external curved surface portions are provided on left and right surfaces of the cylindrical shell portion 49 (the words of "upper," "lower," "left" and "right" denoting upper, lower, left and right directions, respectively, as seen in FIG. 2, this being true hereinafter).

The shell fixing portion 50 is a substantially flange-shaped flat plate portion that is contiguous with a proximal end portion 53 of the cylindrical shell portion 49 and is made to surface contact an external surface of the shielding case 44 or 45. A plurality of bolt passage holes 54, 55 are formed in the shell fixing portion 50. The bolt passage holes 54, 55 are formed so as to match the sizes of the bolts 48. Additionally, a pair of edge portions 56 are formed on the shell fixing portion 50. These edge portions 56 are disposed in upper and lower positions of the shell fixing portion 50 and are formed so as to extend horizontally.

A crimp piece 58 to be crimped is formed continuously on the edge portion 56, and this crimp piece 58 is folded back at the edge portion 56 therealong so as to extend towards a distal end 57 of the cylindrical shell 49. The crimp piece 58 has a rectangular flat plate shape and is disposed so as to face oppositely the corresponding external flat surface portion 51 of the cylindrical shell portion 49 with a predetermined space defined therebetween. Here, the predetermined space means a space into which an end portion 62 of the braid 40, which will be described later, can be inserted.

There is imposed no specific limitation on the crimp piece 58. The crimp piece 58 has a length that enables a distal end 59 thereof to coincide with the distal end 57 of the cylindrical shell portion 49 when a crimping is applied thereto as will be described later.

As will be understood from the following description, the crimp piece 58 is formed as a portion to which crimping is applied and a portion that bears the cylindrical shell portion 49.

As has been described above, the shielding shell 47 is formed so that the crimping applied portion and the crimping bearing portion are integrated into one piece.

Next, the formation of the shielding construction will be described based on the respective configurations described above by reference to FIGS. 2 to 4. Note that in the following description, the illustration of the three high-voltage electric wires 39 and the like will be omitted.

In FIG. 2, reference numeral 60 denotes a main body portion of the braid 40. Additionally, reference numeral 61 denotes a terminating end portion of the braid 40. In this embodiment, the terminating end portion 61 is expanded so as to be slightly wider than the main body portion 60. Additionally, the terminating end portion 61 is expanded into a state in which an end portion 62 thereof has an elliptic shape in section that matches the sectional shape of the cylindrical shell portion 49.

To form the shielding construction, the braid 40 needs to be fixedly connected to the shielding shell 47. Firstly, an operation (a step) is performed of moving the braid 40 in a direction indicated by an arrow P so that the end portion 62 thereof is fitted on the external side of the cylindrical shell portion 49. As this occurs, the end portion 62 of the braid 40 is inserted between the cylindrical shell portion 49 and the pair of crimp pieces 58.

In FIG. 3, after the end portion 62 of the braid 40 is fitted on the external side of the cylindrical shell portion 49, a crimping operation (step) is performed of crimping the crimping pieces 58 by crimping molds, not shown, from directions indicated by arrows Q. This operation is a final one in forming the shielding construction. In this embodiment, a bearing mold, not shown, is inserted into the inside of the cylindrical shell portion 49.

In FIG. 4, when the crimp pieces 58 are crimped, a depressed crimped portion 63 is formed on each of the crimp pieces 58 so crimped. The crimped portions 63 constitute portions that hold the end portion 62 of the braid 40 over a sufficient width to thereby press fasten the end portion 62 between the cylindrical shell portion 49 and themselves. Thus, when these crimped portions 63 are so formed, the fixedly connecting of the braid 40 to the shielding shell 47 is completed, this ending the formation of the shielding construction.

Thus, as has been described by reference to FIGS. 1A to 4, in crimping the braid 40, which is the shielding member, so as to be fixedly connected to the shielding shell 47, since the crimp pieces 58 are integrated with the shielding shell 47, according to the shielding construction of the invention, the shielding member can be fixedly connected to the shielding shell 47 with one component, compared with the related art shielding construction in which the shielding member is fixedly connected to the shielding shell with the two components of the shielding shell and the shielding ring.

Consequently, according to the shielding construction of the invention, it is possible not only to reduce the number of components involved but also to reduce the number of working steps compared with the related art shielding construction. As a result, the shielding construction according to the invention is advantageous in that it is possible to realize not only an improvement in working performance but also a reduction in the number of components involved and production costs.

In addition to this, since the crimp pieces 58 are formed into the flat plate-like shape and are disposed so as to face oppositely the external flat surface portions 51 of the cylindrical shell portion 49, the crimped state can be stabilized more than when they are formed into curved surfaces, for example. Consequently, there is provided an advantage that the strength can be ensured.

Since the wiring harness 8 adopts the shielding construction that has been described heretofore, by using the wiring harness 8 it becomes possible to realize not only the improvement in working performance but also the reduction in the number of components involved and production costs. Additionally, the invention is advantageous in that the better wiring harness 8 can be provided compared with the wiring harness adopting the related art shielding construction.

In the above description, while the braid 40 is described as being the shielding member, the invention is not limited thereto. For example, a shielding member including a metallic foil may be adopted. Additionally, while the crimp pieces 58 are formed continuously on the edge portions 56 of the shell fixing portion 50, the invention is not limited thereto. The crimp pieces 58 may be formed continuously at the proximal end portion 53 of the cylindrical shell portion 49. Further, while the shielding shell 47 is formed by pressing the piece of sheet metal, the invention is not limited thereto. For example, a shielding shell 47 may be made through die casting. In the case of the shielding shell 47 being made through die casting, aluminum die casting can be raised as one example. It is effective to crimp pieces are integrated with a shielding shell of aluminum diecast.

It is apparent that various modifications can be made in the invention within a scope not deviating from the gist of the invention.

The present invention is useful for providing a shielding construction that can realize an improvement in working performance and a reduction in the number of components involved and production costs.

What is claimed is:

1. A shielding construction in which crimping is adopted in fixedly connecting a conductive shielding shell with a conductive shielding member that covers one or a plurality of conductive paths, the conductive shielding shell having a cylindrical shell portion formed into a cylindrical configuration and a shell fixing portion that is contiguous with a proximal end portion of the cylindrical shell portion, the shielding construction comprising:
   one or a plurality of crimp pieces that are formed integrally with the conductive shielding shell so as to extend towards a distal end of the cylindrical shell portion, and the crimp pieces are each formed into a flat plate-like shape as a form resulting before crimping, wherein
   the shielding shell is formed by pressing a piece of sheet metal, and the crimp pieces are formed by being folded back at edge portions of the shell fixing portion therealong or being folded back at the proximal end portion of the cylindrical shell portion.

2. A shielding construction as set forth in claim 1, wherein the crimp pieces are disposed on external flat surface portions of the cylindrical shell portion so as to face oppositely each other.

3. A wiring harness comprising a shielding construction as set forth in claim 1.

4. A wiring harness comprising:
   a plurality of conductive paths;
   a conductive shielding member that covers each of the conductive paths;
   a conductive shielding shell including a cylindrical shell portion formed into a cylindrical configuration, and a shell fixing portion that is contiguous with a proximal end portion of the cylindrical shell portion; and
   one or a plurality of crimp pieces that are formed integrally with the conductive shielding shell so as to extend towards a distal end of the cylindrical shell portion, the crimp pieces are each formed into a flat plate-like shape as a form resulting before crimping, wherein
   the shielding shell is formed by pressing a piece of sheet metal, and the crimp pieces are formed by being folded back at edge portions of the shell fixing portion therealong or being folded back at the proximal end portion of the cylindrical shell portion, and wherein
   each crimp piece is deformed toward the cylindrical shell portion such that the conductive shielding member is crimped between each crimp piece and the cylindrical shell portion.

* * * * *